(12) United States Patent
Choi et al.

(10) Patent No.: US 8,426,861 B2
(45) Date of Patent: Apr. 23, 2013

(54) ORGANIC LIGHT EMITTING DISPLAY DEVICE

(75) Inventors: Hongseok Choi, Seoul (KR);
ChangWook Han, Seoul (KR);
SungJoon Bae, Kyungi-do (KR);
HeeSuk Pang, Kyungi-do (KR); MinSu Kim, Kyungi-do (KR); HwaKyung Kim, Kyungi-do (KR)

(73) Assignee: LG Display Co., Ltd., Seoul (KR)

( * ) Notice: Subject to any disclaimer, the term of this patent is extended or adjusted under 35 U.S.C. 154(b) by 125 days.

(21) Appl. No.: 13/152,738

(22) Filed: Jun. 3, 2011

(65) Prior Publication Data

US 2012/0097954 A1  Apr. 26, 2012

(30) Foreign Application Priority Data

Oct. 21, 2010 (KR) ........................ 10-2010-0102924

(51) Int. Cl.
*H01L 51/54* (2006.01)
(52) U.S. Cl.
USPC .......................................................... 257/59
(58) Field of Classification Search .............. 257/59,
257/27, 72, 83, 290, 351, 368, 392, 66, E21.7,
257/E29.003, E29.295, 223, 227, 291, 292,
257/439, 443, 655, E27.125, E27.112, E29.117,
257/E29.145, E29.147, E29.151, E29.182,
257/E29.202, E29.273–E29.299, E29.314,
257/E29.32, E23.016, E21.094, E21.104,
257/E21.121, E21.372, E21.411–E21.416,
257/252–254, 257–258, 88, 99, E33.059,
257/E21.503, 40, 642–643, 759, E51.001–E51.052,
257/E25.008–E25.009; 438/149, 163, 30,
438/438/48, 128, 151, 157, 161, 283, 29,
438/69, 82, 99, 28
See application file for complete search history.

(56) References Cited

U.S. PATENT DOCUMENTS

| 7,075,501 | B1 * | 7/2006 | Spitzer et al. | 345/8 |
| 7,476,908 | B2 * | 1/2009 | Yamazaki et al. | 257/93 |
| 8,294,154 | B2 * | 10/2012 | Yamazaki et al. | 257/59 |
| 8,305,311 | B2 * | 11/2012 | Choi et al. | 345/83 |
| 2001/0040644 | A1 * | 11/2001 | Vu et al. | 349/42 |
| 2004/0070697 | A1 * | 4/2004 | Vu et al. | 349/43 |
| 2005/0110013 | A1 * | 5/2005 | Zhong et al. | 257/59 |
| 2007/0188089 | A1 * | 8/2007 | Choi et al. | 313/506 |
| 2008/0079001 | A1 * | 4/2008 | Umezaki et al. | 257/59 |
| 2009/0251048 | A1 * | 10/2009 | Choi et al. | 313/504 |
| 2012/0138939 | A1 * | 6/2012 | Matsushima et al. | 257/59 |

\* cited by examiner

*Primary Examiner* — Dao H Nguyen
*Assistant Examiner* — Tram H Nguyen
(74) *Attorney, Agent, or Firm* — Morgan, Lewis & Bockius LLP

(57) ABSTRACT

The present invention further relates to an OLED device, including R, G, B, and W subpixels. Specifically, the OLED device comprises a substrate; a thin film transistor (TFT) active layer disposed on the substrate, comprising a gate electrode, a gate insulating layer, an active layer, an interlayer insulating layer, a source electrode, and a drain electrode; an overcoat layer disposed over the thin film transistor; and a passivation layer disposed between the thin film transistor and the overcoat layer, wherein the passivation layer is absent in a path of a light or wherein the passivation layer is disposed in the path of the light as a single layer comprising silicon nitride.

9 Claims, 7 Drawing Sheets

ORGANIC LIGHT EMITTING DISPLAY DEVICE

CROSS REFERENCE TO RELATED APPLICATIONS

This application claims the benefit of Korean Patent Application No. 10-2010-0102924 filed on Oct. 21, 2010, which is hereby incorporated by reference.

FIELD OF THE INVENTION

The present invention relates to an organic light emitting display (OLED) device, and more particularly to an OLED device capable of improving color uniformity of white (W) light.

BACKGROUND OF THE INVENTION

Recently, a flat panel display (FPD) is gaining much interest as a focus of an advancement of multimedia technology. Thereby, a variety of flat panel displays, such as a liquid crystal display (LCD), a plasma display panel (PDP), a field emission display (FED), and OLED devices using organic light emitting diodes, have been put into practical use.

Particularly, the OLED device provides a fast response time of 1 ms or less, has low power consumption, and is a self emission type. In addition, the OLED device has a broad viewing angle, and thus is advantageous as a moving image display medium regardless of its size. Further, the OLED device can be manufactured at low temperature, be simply manufactured based on the existing active layer process technique, and thus attracts attention as a next-generation flat panel display.

The OLED device includes a first electrode, a second electrode, and an emission layer between the first electrode and the second electrode. Holes supplied from the first electrode and electrons supplied from the second electrode are bonded together in the emission layer to form the exciton, which is a pair of a hole and an electron, and the OLED device emits light by the energy generated when the exciton returns to a bottom level.

Such OLED devices have been developed to have various structures, and, among them, a white OLED device implements a white light by including red, green, and blue subpixels, or implements a white light by further including white subpixels in addition to the red, green, and blue subpixels.

Implementing a white light, however, has been problematic because inorganic films form under the emission layer of the OLED device. This causes the viewing angle characteristic and the color uniformity of the OLED device to be deteriorated. Accordingly, a better implementation of the white light would be beneficial in manufacturing an OLED with a broader viewing angle and/or better color uniformity.

SUMMARY OF THE INVENTION

The present invention relates to an OLED device capable of improving the viewing angle characteristic and/or the color uniformity.

The present invention further relates to an OLED device comprising red (R), green (G), blue (B), and white (W) subpixels. Specifically, the OLED device comprises i) a substrate; ii) a thin film transistor (TFT) active layer disposed on the substrate, comprising a gate electrode, a gate insulating layer, an active layer, an interlayer insulating layer, a source electrode, and a drain electrode; iii) an overcoat layer disposed over the thin film transistor; and iv) a passivation layer disposed between the thin film transistor and the overcoat layer, wherein the passivation layer is absent in a path of a light or wherein the passivation layer is disposed in the path of the light as a single layer comprising silicon nitride

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Reference will now be made in detail to some embodiments of the present invention, examples of which are illustrated in the accompanying drawings.

The following figures, embodiments and Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and/or alterations can be employed without departing from the scope of the presently disclosed subject matter.

Figure 1:
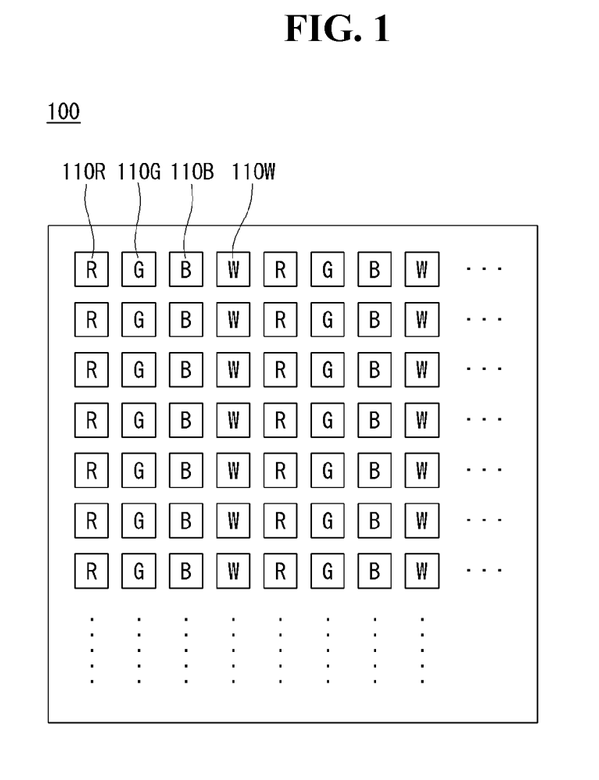
FIG. 1 depicts an OLED device according to one embodiment of the present invention.

In FIG. 1 according to one embodiment of the present invention, the OLED device 100 comprises a plurality of unit pixels comprising Red subpixels 110R, Green subpixels 110G, Blue subpixels 110B, and White subpixels 110W. Each of the unit pixels emits red, green, blue and white light and thus implements white color.

Figure 2:
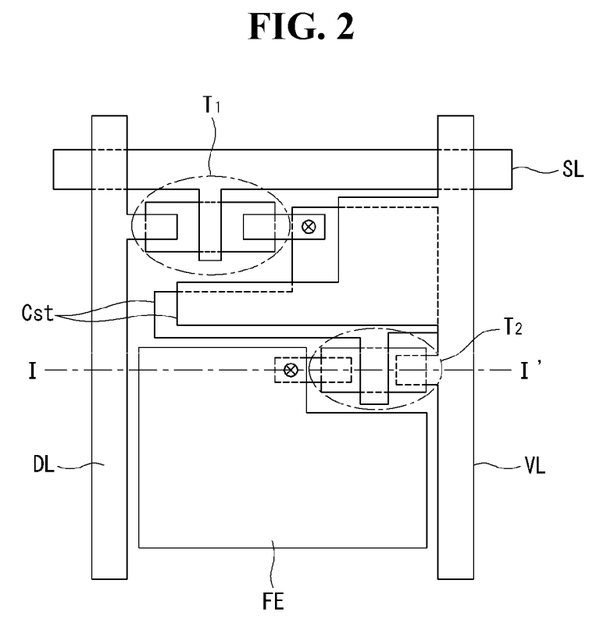
FIG. 2 depicts a subpixel of an OLED device according to another embodiment of the present invention.

FIG. 2 shows a structure of the subpixel of an OLED device according to a further embodiment of the present invention, the subpixel is defined by a scan line SL, a data line DL, and a common voltage line VL, which are disposed in a matrix.

The subpixel comprises a switching thin film transistor (TFT) T1, a driving TFT T2, a capacitor Cst, a first electrode FE, an emission layer (not shown), and a second electrode (not shown).

In the subpixel according to some embodiments, when signals are initiated from the scan line SL and the data line DL, a driving signal is transmitted from the switching TFT T1 to the driving TFT T2 via the capacitor Cst. The driving TFT T2 transmits currents to the first electrode FE due to the signal applied from the switching TFT T1 and the signal applied from the common voltage line VL. In addition, an organic layer (not shown) emits light due to the currents applied from the first electrode FE and the second electrode (not shown).

Figure 3:
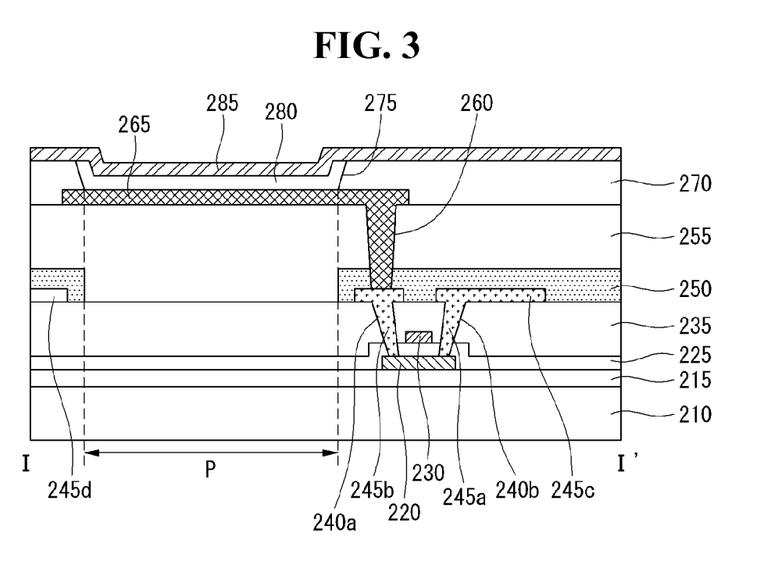
FIG. 3 is a cross-sectional view illustrating a W subpixel of an OLED device according to an additional embodiment of the present invention.

In FIG. 3 according to an additional embodiment of the present invention, the W subpixel of an OLED device comprises a buffer layer 215 on a substrate 210. The substrate 210 may be made of materials, including, but not limited to, glass, plastic and a conductive material. The buffer layer 215 is optionally formed for protecting TFTs described herein from impurities, such as alkali ions leaked out of the substrate 210. The buffer layer 215 may be made of materials, including, but not limited to, silicon oxide SiOx and silicon nitride SiNx.

An active layer 220 is disposed on the buffer layer 215. The active layer 220 may include amorphous silicon and/or polysilicon, which crystallizes the amorphous silicon. Although not shown, the active layer 220 may include a channel region, a source region, and a drain region, where the source region and the drain region may be doped with P type or N type impurities.

A gate insulating layer 225 is disposed on the substrate 210 including the active layer 220. The gate insulating layer 225 insulates the active layer 220, and may be optionally formed using silicon oxide SiOx and/or silicon nitride SiNx.

A gate electrode 230 is disposed on a constant region of the active layer 220, that is, on the gate insulating layer 225 corresponding to the channel region. The gate electrode 230 may be made of one or more selected from the group including, but not limited to, aluminum Al, aluminum alloy, titanium Ti, silver Ag, molybdenum Mo, molybdenum alloy, tungsten W, and tungsten silicide $WSi_2$.

An interlayer insulating layer 235 is disposed on the substrate 210 including the gate electrode 230. The interlayer insulating layer 235 may be an organic layer or an inorganic layer, or may be a composite layer thereof. The inorganic layer may comprise materials, including, but not limited to silicon nitride SiNx and SOG (silicate on glass). The organic layer may comprise materials, including, but not limited to, acryl based resin, polyimide based resin, and benzocyclobutene (BCB) based resin.

A source electrode 245a, a drain electrode 245b, and signal lines 245c and 245d are disposed on the interlayer insulating layer 235. Specifically, the signal lines 245c and 245d may be a common voltage line and a data line, respectively.

The source electrode 245a, the drain electrode 245b, the common voltage line 245c, and the data line 245d may include a low resistance material so as to reduce a wire resistance, and may be formed of a multi-layer film comprising a material including, but not limited to, molybdenum-tungsten MoW, titanium Ti, and aluminum Al and aluminum alloy. The multi-layer film may have a laminated structure of titanium/aluminum/titanium (Ti/Al/Ti) or molybdenum-tungsten/aluminum/molybdenum-tungsten (MoW/Al/MoW).

The source electrode 245a and the drain electrode 245b are connected to the active layer 220 via contact holes 240a and 240b, which penetrate through the interlayer insulating layer 235 and the gate insulating layer 225. Thus, a thin film transistor (TFT) includes the gate electrode 230, the active layer 220, the source electrode 245a and the drain electrode 245b.

A passivation layer 250 is disposed on the source electrode 245a, the drain electrode 245b, the common voltage line 245c, and the data line 245d. The passivation line 250 covers the source electrode 245a, the drain electrode 245b, the common voltage line 245c, and the data line 245d. Therefore, in some embodiments, the passivation layer 250 is not formed on regions other than the source electrode 245a, the drain electrode 245b, the common voltage line 245c, and the data line 245d, and the interlayer insulating layer 235 is disposed thereon.

The passivation layer 250 comprises a material, including, but not limited to silicon oxide SiOx and silicon nitride SiNx, and may be formed as a single layer, double layers, or other multiple layers. The OLED device according to one embodiment of the present invention is a rear surface emission OLED device in which light from the emission layer travels toward the substrate 210, and thus has an advantage in terms of preventing color uniformity of light from being reduced since the passivation layer 250 is not positioned in the path (P) of the light emitted from the emission layer of an organic layer 280.

An overcoat layer 255 is disposed on the passivation layer 250 and the interlayer insulating layer 235. The overcoat layer 255 protects color filters and makes a step difference smooth due to the color filter. The W subpixel shown in FIG. 3 of some embodiments is not provided with a color filter because white light is implemented. Therefore, only the overcoat layer 255 is disposed on the interlayer insulating layer 235 and the passivation layer 250.

A first layer 265 is disposed on the overcoat layer 255. The first layer 265 may be a transparent conductive film made of a material, including, but not limited to ITO (indium tin oxide) and IZO (indium zinc oxide). The first layer 265 is electrically connected to the drain electrode 245b of the TFT through a via hole 260 which penetrates through the overcoat layer 255 and the passivation layer 250.

A bank layer 270 is disposed on the substrate 210 and, more particularly, on the first layer 265. The bank layer 270 defines an emission region of the subpixel, and may comprise acryl based resin, polyimide based resin, benzocyclobutene (BCB) based resin, or the mixture thereof. Further, the bank layer 270 has an opening 275 which exposes a portion of the first layer 265.

An organic layer 280 is disposed on the first layer 265 exposed by the opening 275 and optionally on the bank layer 270. The organic layer 280 includes at least an emission layer, and may include at least one of a hole injection layer, a hole transport layer, an electron transport layer, and an electron injection layer.

The W subpixel shown in FIG. 3 according to some embodiments of the present invention emits white light, and the emission layer of the organic layer 280 can implement white light. Specifically, the emission layer may emit white light by including materials emitting red, green, and blue lights.

A second electrode 285 is disposed on the substrate 210 and, more particularly, on the organic layer 280. The second electrode 285 is positioned on the entire surface of the substrate 210 and may be made of a material, including, but not limited to magnesium Mg, silver Ag, calcium Ca, and an alloy thereof.

As described above, the W subpixel of the OLED device according to one embodiment of the present invention is formed by removing the passivation layer from the region where light is emitted. The inventors surprisingly found that disposing the overcoat layer 255, the interlayer insulating layer 235, and the gate insulating layer 225 under the first layer 265 prevents the color uniformity of the white light from being reduced and maintains the good color uniformity of the white light.

On the other hand, the R, G and B subpixels of some embodiments of the present invention may further include color filters unlike the W subpixel emitting the white light. As follows, the R subpixel out of the R, G and B subpixels will be described as a representative. The constituent elements which are the same as in FIG. 3 above are given the same reference numerals, and the description thereof is omitted below.

Figure 4:
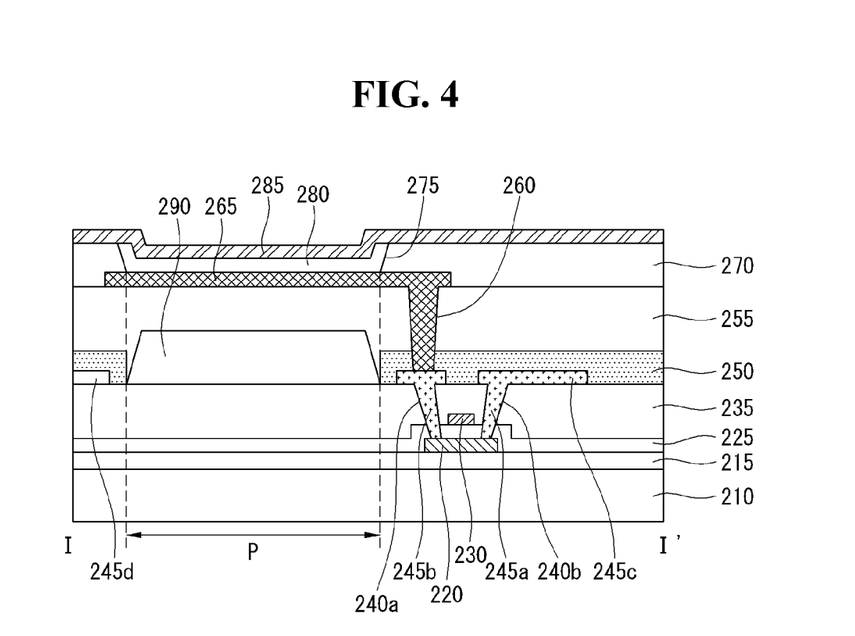
FIG. 4 is a cross-sectional view illustrating an R subpixel of the OLED device according to yet an additional embodiment of the present invention.

In FIG. 4 according to one embodiment of the present invention, unlike the W subpixel, in the R subpixel, an R color filter 290 is further formed on the interlayer insulating layer 235 where the passivation layer 250 is not formed.

More specifically, the R color filter 290 is disposed on the path (P) of light emitted from the organic layer 280, that is, under the first layer 265. The R color filter 290 converts the white light emitted from the organic layer 280 into red light. Thereby, the R subpixel can implement red light by converting the white light into the red light through the R color filter 290.

In the same manner as the above-described W subpixel, the passivation layer 250 is not formed on the path (P) of the emitted light. The inventors surprisingly found that disposing the overcoat layer 255, the R color filter 290, the interlayer insulating layer 235, and the gate insulating layer 225 under the first layer 265 improves the color uniformity of the red light by preventing the color uniformity of the white light from being reduced.

Although the R subpixel has been described with reference to FIG. 4, the G subpixel and the B subpixel may also have the same structure as the R subpixel and respectively include a G color filter and a B color filter instead of the R color filter.

Figure 5:
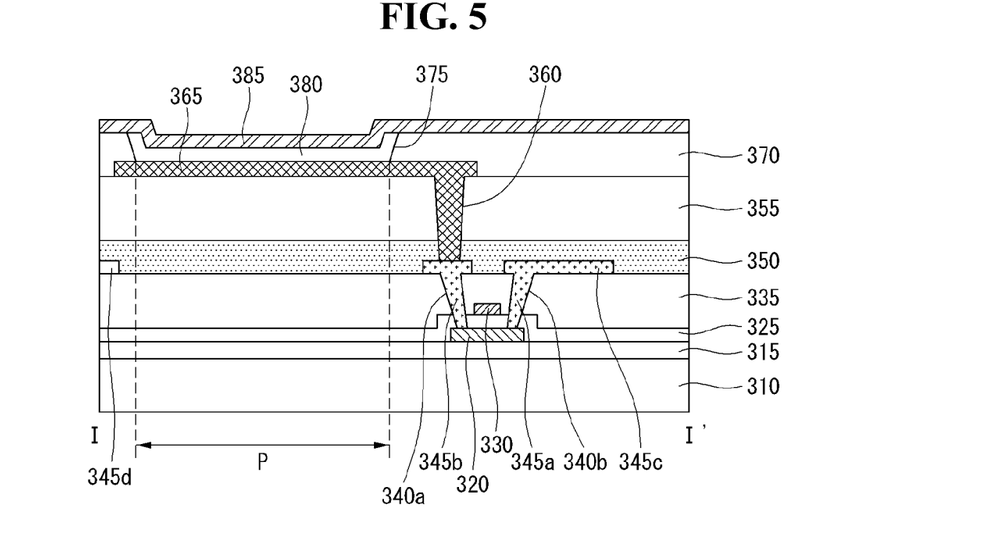
FIG. 5 is a cross-sectional view illustrating a W subpixel of an OLED device according to another embodiment of the present invention.

In FIG. 5 according to another embodiment of the present invention, the W subpixel of the OLED device includes a buffer layer 315 on a substrate 310. An active layer 320 is disposed on the buffer layer 315, and a gate insulating layer 325 is disposed on the substrate 310 including the active layer 320.

A gate electrode 330 is disposed on the gate insulating layer 325, and an interlayer insulating layer 335 is disposed on the substrate 310, more particularly, on the gate electrode 330. A source electrode 345a, a drain electrode 345b, and signal lines 345c and 345d are disposed on the interlayer insulating layer 335. Specifically, the signal lines 345c and 345d may be a common voltage line and a data line, respectively.

The source electrode 345a and the drain electrode 345b are connected to the active layer 320 via contact holes 340a and 340b which penetrate through the interlayer insulating layer 335 and the gate insulating layer 325. A passivation layer 350 is disposed on the source electrode 345a, the drain electrode 345b, the common voltage line 345c, and the data line 345d.

The passivation layer 350 is disposed on the entire substrate 310 including the source electrode 345a, the drain electrode 345b, the common voltage line 345c, and the data line 345d. The passivation layer 350 may be formed of a single layer of silicon nitride SiNx. The inventors found that it is advantageous in terms of preventing the color uniformity of light from being reduced due to the characteristics of the silicon nitride SiNx. The passivation layer 350 may also be formed of a single layer of silicon nitride and is disposed in the path (P) of light emitted from a subsequent emission layer.

An overcoat layer 355 is disposed on the passivation layer 350, and a first electrode 365 is disposed on the overcoat layer 355. The first layer 365 is electrically connected to the drain electrode 345b of the TFT through a via hole 360 which penetrates through the overcoat layer 355 and the passivation layer 350.

A bank layer 370 is disposed on the substrate 310 including the first layer 365, and the bank layer 370 has an opening 375 which exposes a portion of the first layer 365. An organic layer 380 is disposed on the first layer 365 and the bank layer 370 exposed by the opening 375. The W subpixel shown in FIG. 5 according to some embodiments of the present invention emits white light, and the emission layer of the organic layer 380 can implement white light. Specifically, the emission layer may emit white light by including materials emitting red, green, and blue lights. A second electrode 385 is disposed on the substrate 310 including the organic layer 380.

As described above, the W subpixel of the OLED device according to one embodiment of the present invention has the passivation layer, which is formed of a single layer made of silicon nitride, in the region where light is emitted. The inventors surprisingly found that disposing the overcoat layer 355, the passivation layer 350, the interlayer insulating layer 335, and the gate insulating layer 325 under the first layer 365 prevents the color uniformity of the white light from being reduced and maintains the good color uniformity of the white light.

On the other hand, the R, G and B subpixels of some embodiments of the present invention may further include color filters unlike the W subpixel emitting the white light. As follows, the R subpixel out of the R, G and B subpixels will be described as a representative. The constituent elements which are the same as in FIG. 5 above are given the same reference numerals, and the description thereof is omitted below.

Figure 6:
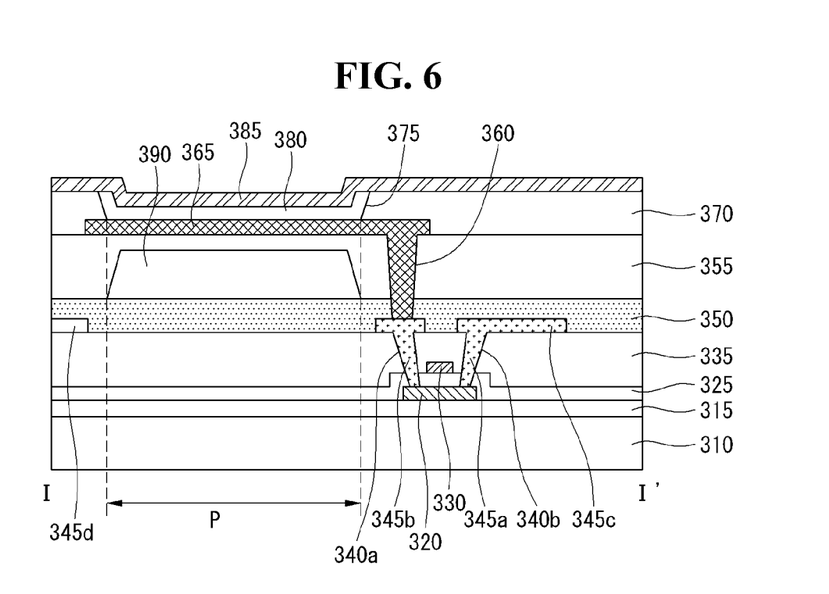
FIG. 6 is a cross-sectional view illustrating an R subpixel of the OLED device according to a yet another embodiment of the present invention.

In FIG. 6 according to one embodiment of the present invention, unlike the W subpixel, in the R subpixel, an R color filter 390 is further formed on the passivation layer 350.

More specifically, the R color filter 390 is disposed on the path (P) of light emitted from the organic layer 380, that is, under the first layer 365. The R color filter 390 converts the white light emitted from the organic layer 380 into red light. Thereby, the R subpixel can implement red light by converting the white light into the red light through the R color filter 390.

In addition, in the same manner as the W subpixel described above, the passivation layer 350 of a single layer made of silicon nitride is formed on the path (P) of emitted light. The inventors surprisingly found that disposing the overcoat layer 355, the R color filter 390, the passivation layer 350, the interlayer insulating layer 335, and the gate insulating layer 325 under the first layer 365 improves the color uniformity of the red light by preventing the color uniformity of the white light from being reduced.

Although the R subpixel has been described with reference to FIG. 6, the G subpixel and the B subpixel may also have the same structure as the R subpixel and respectively include a G color filter and a B color filter instead of the R color filter.

Figure 7:
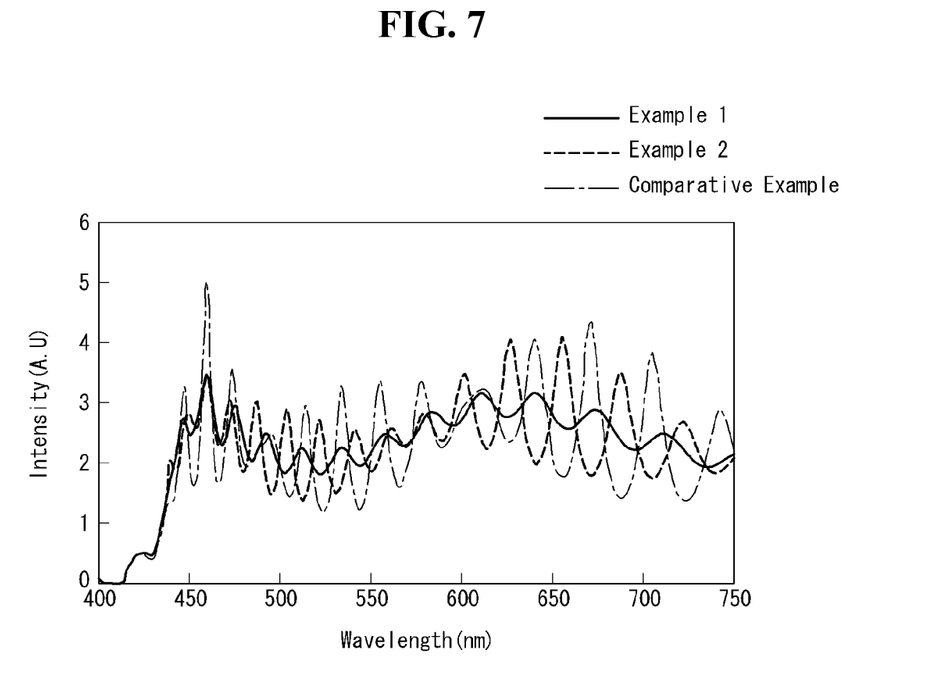
FIG. 7 is a diagram illustrating spectra of white light related to i) an OLED device comprising the W subpixel according to the embodiment in FIG. 3 and the R subpixel according to the embodiment in FIG. 4, and ii) an OLED device comprising the W subpixel according to the embodiment in FIG. 5 and the R subpixel according to the embodiment in FIG. 6.

In FIG. 7, the example 1 indicates a white light spectrum related to an OLED device comprising the W subpixel according to the embodiment in FIG. 3 and the R subpixel according to the embodiment in FIG. 4. The example 2 indicates a white light spectrum related to an OLED device comprising the W subpixel according to the embodiment in FIG. 5 and the R subpixel according to the embodiment in FIG. 6. The comparative example indicates a white light spectrum related to an OLED device where the passivation layer in the example 2 is formed of double layers of silicon oxide SiOx and silicon nitride SiNx on the entire surface of the substrate.

As shown in FIG. 7, it can be seen that a wiggle phenomenon occurs less in the OLEDs according to some embodiments of the present invention than in the comparative example. The inventors surprisingly found that not forming the passivation layer in the region where light is emitted or forming only a single layer of the passivation layer reduces the occurrence of the wiggle phenomenon of the white light. The passivation layer in the single layer is preferably made of silicon nitride.

Therefore, according to the present invention, the color uniformity of the white light can be improved, and in turn the viewing angle characteristic of the OLED device can be improved.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. An organic light emitting display (OLED) device comprising red (R), green (G), blue (B), and white (W) subpixels, wherein the OLED device comprises:
   a substrate;
   a thin film transistor (TFT) active layer disposed on the substrate, comprising a gate electrode, a gate insulating layer, an active layer, an interlayer insulating layer, a source electrode, and a drain electrode;
   an overcoat layer disposed over the thin film transistor; and
   a passivation layer disposed between the thin film transistor and the overcoat layer,
   wherein the passivation layer is absent in a path of a light; and
   wherein a color filter is absent in the W subpixel.

2. The OLED device of claim 1, further comprising
   a first electrode disposed on the overcoat layer;
   a bank layer disposed on the first electrode and exposing the first electrode;
   an organic layer disposed on the exposed first electrode; and
   a second electrode disposed on the organic layer.

3. The OLED device of claim 2, wherein the path of the light is emitted from an emission layer of the organic layer.

4. The OLED device of claim 1, wherein the organic layer in the W subpixel emits red, green, and blue lights to form white light.

5. The OLED device of claim 1, wherein at least one of the R, G, and B subpixels comprises a color filter in the path of the light emitted from the organic layer, and the color filter is located under the first electrode.

6. The OLED device of claim 5, wherein the color filter is on the interlayer insulating layer.

7. The OLED device of claim 1, wherein the overcoat layer and the passivation layer comprises a hole, through which the first electrode is electrically connected to the TFT, and the first electrode is electrically connected to the drain electrode of the TFT.

8. The OLED device of claim 1, wherein the overcoat layer is deposed in the path of the light on the interlayer insulating layer of the W subpixel and on color filters of the R, G, and B subpixels.

9. The OLED device of claim 1, wherein the path of the light is toward the substrate.

* * * * *